United States Patent [19]

Poinas

[11] 4,205,277
[45] May 27, 1980

[54] PHASE LOCKED LOOP WITH SWITCHABLE FILTER

[75] Inventor: Christian Poinas, Boulogne, France

[73] Assignee: Societe Anonyme Dite: Compagnie Industrielle des Telecommunications Cit-Alcatel, Paris, France

[21] Appl. No.: 954,803

[22] Filed: Oct. 26, 1978

[30] Foreign Application Priority Data

Nov. 4, 1977 [FR] France .................................. 77 33248

[51] Int. Cl.² ............................................. H03B 3/04
[52] U.S. Cl. ........................................ 331/12; 331/17; 331/25; 331/DIG. 2
[58] Field of Search .................................... 331/10–12, 331/17, 18, 25, DIG. 2

[56] References Cited

U.S. PATENT DOCUMENTS

| 3,909,735 | 9/1975 | Anderson et al. ................. | 331/10 X |
| 3,983,501 | 9/1976 | Lindstrum ......................... | 331/17 X |
| 4,034,310 | 7/1977 | Coe ................................... | 331/10 X |

OTHER PUBLICATIONS

Hiroshige, IEEE Transactions on Space Electronics and Telemetry, vol. SE1–11, Mar. 1965, pp. 40–46.
McGeehan, Proceedings of the IEEE, vol. 123, No. 8, Aug. 1976, pp. 761–764.

*Primary Examiner*—Siegfried H. Grimm
*Attorney, Agent, or Firm*—Sughrue, Rothwell, Mion, Zinn and Macpeak

[57] ABSTRACT

Disclosed is a phase-locked loop which comprises a voltage controlled variable frequency oscillator (1), a phase comparator (2) having a cosine characteristic and receiving a reference oscillation as well as that supplied by the oscillator (1), and a low-pass filter (3) connected between the output of the phase comparator (2) and a frequency control input of the oscillator (1).

The transfer function of the low-pass filter (3) is switchable between two characteristics depending on the instantaneous phase difference between the reference oscillation and that supplied by the oscillator. The first low-pass filter transfer function is adapted to the phase-locked operation of the loop, while the second transfer function is adapted for frequency capture.

8 Claims, 4 Drawing Figures

PHASE LOCKED LOOP WITH SWITCHABLE FILTER

FIELD OF THE INVENTION

The present invention comes within the field of electronics. It relates to phase-locked loops which comprise a voltage controlled variable frequency oscillator, a phase comparator having a cosine characteristic and receiving a reference oscillation as well as that supplied by the oscillator, and a low-pass filter connected between the output of the phase comparator and a frequency control input of the oscillator.

BACKGROUND OF THE INVENTION

A phase-locked loop locks both the phase and the frequency of a controlled oscillator with those of a reference oscillation. For some applications, in particular coherent detection and selective filtering with cancellation of noise, it is necessary to make the pass band of the closed loop as narrow as possible. This is detrimental to the natural capture (pull-in) properties of the loop which, on the contrary, require the pass band of the closed loop to be as wide as possible.

A known way of meeting these contradictory requirements consists in having a low-pass filter with a switchable structure depending on the instantaneous phase difference between the reference oscillation and that supplied by the oscillator. Due to this switchable structure the low-pass filter has two distinct transfer characteristics, one giving a narrow band to the closed loop after capture and the other shortening the capture time of the loop.

SUMMARY OF THE INVENTION

The present invention aims to improve the capture characteristics of a phase-locked loop such as described above.

It provides a phase-locked loop which includes: a voltage controlled variable-frequency oscillator, a first cosine characteristic phase comparator which receives at its inputs a reference oscillation and an oscillation supplied by the oscillator, a first low-pass filter connected between the output of the phase comparator and a frequency control input of the oscillator, said low pass filter being provided with a switchable structure which can select one of two possible configurations, a second cosine characteristic phase comparator whose inputs receive the reference oscillation and the oscillation which comes from the oscillator, one of these oscillations having previously been delayed by $\pi/2$ radians by a phase shifter, a second low-pass filter connected to the output of the second phase comparator, a polarity detector connected to the output of the second low-pass filter, a switching circuit controlled by the polarity detector for switching between the two possible configurations of the first low-pass filter, wherein in a first configuration, the first low-pass filter has a transfer function of the form:

$$F_1(p) = \frac{a+p}{p} \cdot \frac{1}{p+c}$$

with a and c as real and positive constants and p as the complex variable of the Laplace transform, and in a second configuration, said filter has a transfer function of the form:

$$F_2(p) = \frac{a - \alpha p}{p} \cdot \frac{1}{p+c}$$

with $\alpha$ as a real and positive non-zero constant.

An embodiment of the invention is described by way of example, with reference to the accompanying drawings.

DESCRIPTION OF THE PREFERRED EMBODIMENT

Figure 1:
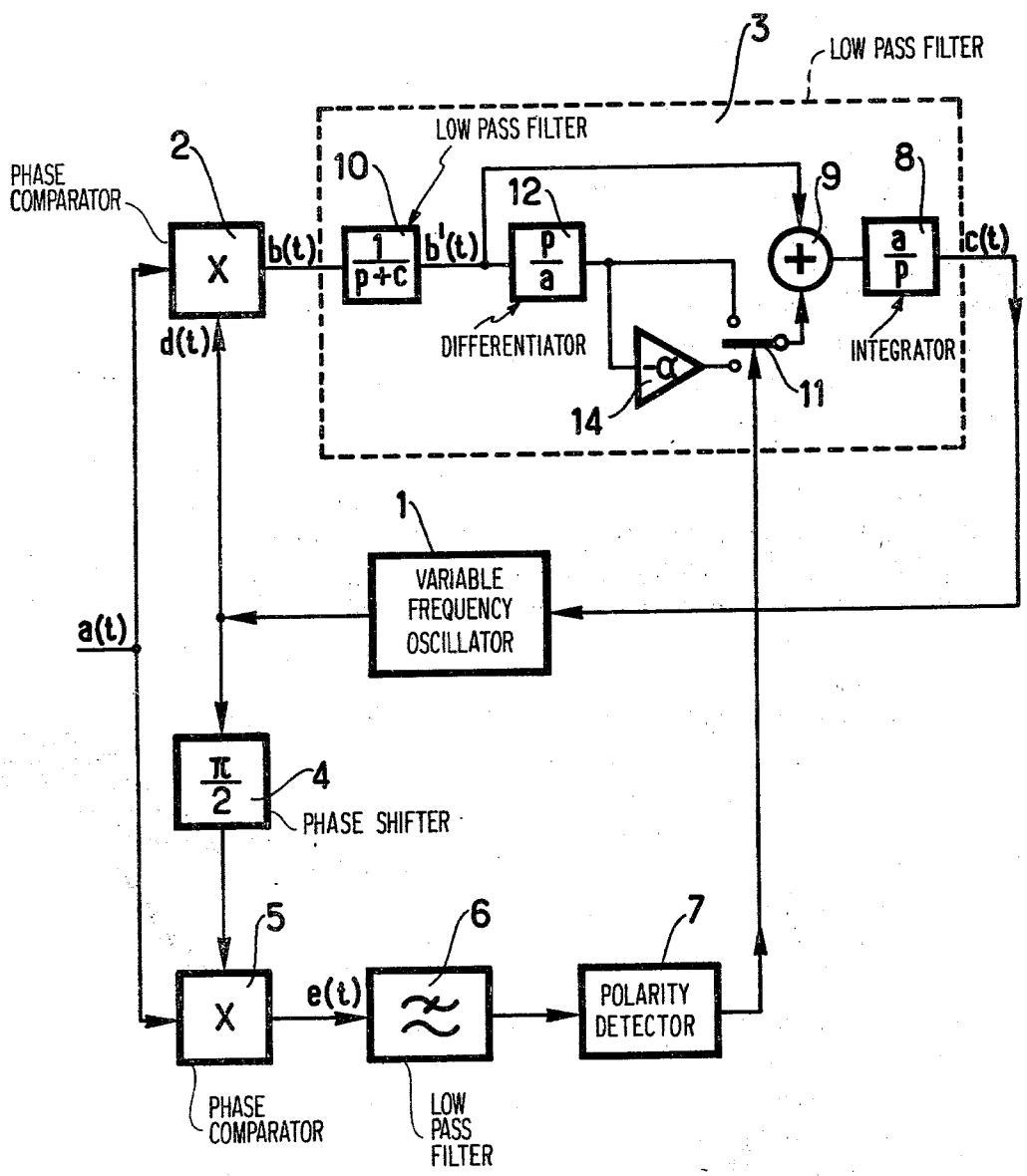
FIG. 1 is the block diagram of a phase-locked loop in accordance with the invention.

The phase-locked loop illustrated in FIG. 1 comprises:

a variable frequency oscillator 1 controlled by a signal c(t), producing an oscillation d(t) of phase $\theta'(t)$ and having a positive modulation sensitivity $K_2$ expressed in rad/s/volt and a free running angular frequency $\omega_0$ where:

$$\frac{d\theta'}{dt} = \omega_o + K_2 c(t) \qquad (1)$$

a first cosine characteristic phase comparator 2 whose inputs receive reference oscillation a(t) of phase $\theta(t)$ together with the oscillation d(t) which comes from the oscillator 1, and whose output supplies an output signal b(t);

a first low-pass filter 3 represented by a dashed line rectangle and disposed between the output of the first phase comparator 2 which supplies it with the signal b(t) and a frequency control input of the oscillator 1 to which it supplies the signal c(t);

a phase shifter 4 which introduces a phase delay of $\pi/2$ radians and receives the signal d(t) which comes from the oscillator 1;

a second cosine characteristic phase comparator 5 which receives the reference oscillation a(t) and the output signal of phase shifter 4 on its input and supplying a signal e(t) on its output;

a second low-pass filter 6 connected to the output of the second phase comparator 5;

a polarity detector 7 connected to the output of the second low-pass filter 6; and a switching circuit included in the first low-pass filter 3 and controlled by the polarity detector 7.

The first low-pass filter 3 is formed by an integrator circuit 8 preceded by a two-input summing circuit 9 having both its inputs connected to the output of a low-pass circuit, one directly and the other via a changeover switch 11 or via a differentiator circuit 12 or via an inverting amplifier 14 and via the differentiator circuit 12. The input of the first low-pass filter 3 is the input to low-pass circuit 10 and the output of the filter 3 is taken from the output of the integrator circuit 8.

The integrator circuit 8 has a transfer function of the form a/p where a is a real positive constant; the circuit 10 has a transfer function of the form $1/(p+c)$ where c is a real positive constant and p is a complex variable of the Laplace transform, the differentiator circuit 12 has a transfer function of the form $p/a$; and the inverting amplifier 14 has a gain of $-a$.

The changeover switch 11 constitutes the above-mentioned switching circuit. It is controlled by the polarity detector 7.

When the polarity detector 7 detects a negative output signal at the output of the second low-pass filter 6, it connects the second input of the summing circuit 9 to the output of the differentiator circuit 12. This causes the first low-pass filter 3 to have the transfer function:

$$F_1(p) = \frac{1}{p+c} \cdot \left(1 + \frac{p}{a}\right) \cdot \frac{a}{p} = \frac{1}{p+c} \cdot \frac{a+p}{p}$$

When the polarity detector 7 detects a positive signal at the output of the second low-pass filter 6, it connects the second input of the summing circuit 9 to the output of the inverting amplifier 14. This causes the first low-pass filter 3 to have the transfer function:

$$F_2(p) = \frac{1}{p+c} \cdot \left(1 - a\frac{p}{a}\right)\frac{a}{p} = \frac{1}{p+c} \cdot \frac{a-ap}{p}$$

The two cosine characteristic phase comparators 2 and 5 are identical and are usually formed by an analog multiplier such as a ring modulator. Their responses include two components, one at the lower beat frequency and the other at the upper beat frequency of the signals applied to their inputs. The first and second low-pass filters 10 and 6 cut out the upper beat frequency components of the first and second phase comparators 2 and 5.

The transfer function $F_1(p)$ of the first low-pass filter is that of a conventional second order phase-locked loop filter and the coefficients a and c are determined in accordance with the usual criteria for this kind of loop. The value $a$ in the transfer function $F_2(p)$ is a non-zero positive constant.

The phase-locked loop which has just been described with reference to FIG. 1 has improved capture characteristics in comparison with conventional second order phase-locked loops. These improved characteristics are demonstrated by comparing the operation of the phase-locked loop illustrated in FIG. 1 with that of a conventional second order phase-locked loop during their capture period. Such a comparison requires a clear explanation of how the phase-locked loop illustrated in FIG. 1 operates, i.e. how the instantaneous angular frequency of the oscillator 1 is related to the phase difference between the signals a(t) and d(t) which are applied to the input of the first phase comparator 2.

Firstly, we explain the conditions which govern the operation of the switching circuit which modifies the configuration of the first low-pass filter 3. The reference oscillations a(t) and d(t) which come from the oscillator 1 have the following forms:

$a(t) = V_1 \sin \theta (t)$ $d(t) = V_2 \sin \theta'(t)$

Assuming that the two identical phase comparators 2 and 5 are each formed by an analog multiplier of gain $K_1$ and considering the phase delay of $\pi/2$ radians introduced by the phase shifter 4, the signal e(t) of the second phase comparator 5 may be expressed in the form:

$$e(t) = K_1 V_1 V_2 \sin \theta (t) \cdot \sin \left(\theta'(t) + \frac{\pi}{2}\right)$$

which is the same as:

$e(t) = \frac{1}{2} K_1 V_1 V_2 [\sin(\theta(t) - \theta'(t)) + \sin(\theta(t) + \theta'(t))]$ Since the second low-pass filter 6 cuts out the upper beat frequency the input of the polarity detector 7 receives the signal:

$\frac{1}{2} K_1 V_1 V_2 \sin (\theta(t) - \theta'(t))$

The condition which governs the operation of the switching circuit is therefore the sign of $\sin (\theta(t) - \theta'(t))$. Assuming that the constant $K_1$ is positive, it may be stated that the transfer function of the first low-pass filter 3 is defined by the system of equations:

$$\begin{cases} F_1(p) = \frac{1}{p+c} \cdot \frac{a+p}{p} & \text{when } \sin (\theta(t) - \theta'(t)) < 0 \\ F_2(p) = \frac{1}{p+c} \cdot \frac{a-ap}{p} & \text{when } \sin (\theta(t) - \theta'(t)) \geq 0 \end{cases} \quad (2)$$

The equation of operation of the phase-locked loop is obtained by expressing the equations which relate the input and output magnitudes respectively of the first phase comparator 2, of the low-pass filter 3 and of the oscillator 1.

With the previously adopted assumptions, the response b(t) of the first phase comparator 2 has the form:

$b(t) = K_1 V_1 V_2 \sin \theta(t) \cdot \sin \theta'(t)$ which is the same as:

$b(t) = \frac{1}{2} K_1 V_1 V_2 [\cos (\theta(t) - \theta'(t)) - \cos (\theta(t) + \theta'(t))]$ The low-pass circuit 10 at the input of the low-pass filter 3 cuts out the upper beat frequency at $\theta + \theta'$ so that at its output, the signal b'(t) is of the form:

$b'(t) = \frac{1}{2} K_1 V_1 V_2 \cos (\theta(t) - \theta'(t))$ \quad (3)

The output signal of the first low-pass filter 3 may be expressed by the equation:

$$c(t) = c_o(t) + \int_o^t f(t - u) b'(u) du$$

where c(t) is the response of the filter downstream of the low pass circuit 10, $c_o(t)$ is the response of the filter to a zero input signal b'(t), U is a real variable of integration, and f(t) is the impulse response of the filter. Assuming that the starting conditions are zero, the function $c_o(t)$ is zero:

$$c(t) = \int_o^t f(t - u) b'(u) du \quad (4)$$

By combining equations (1), (3) and (4), we obtain $$\frac{d\theta'}{dt} = \omega_o + \tfrac{1}{2} K_1 K_2 V_1 V_2 \int_0^t f(t-u) \cos(\theta(u) - \theta'(u)) \, du$$

Considering the fact that the transfer function of the first filter 3 without the low-pass circuit 10 is defined by the system of equations:

$$F_1'(p) = \frac{a+p}{p} \quad \text{when } \sin(\theta(t) - \theta'(t)) < 0$$

$$F_2'(p) = \frac{a - \alpha p}{p} \quad \text{when } \sin(\theta(t) - \theta'(t)) \geq 0$$

We obtain the following system of equations:
When $\sin(\theta(t) - \theta'(t)) < 0$ $$\frac{d}{dt}\left(\frac{d\theta'}{dt} - \omega_o\right) = \frac{a}{2} K_1 K_2 V_1 V_2 \cos(\theta(t) - \theta'(t)) -$$

$$\tfrac{1}{2} K_1 K_2 V_1 V_2 \sin(\theta(t) - \theta'(t)) \left(\frac{d\theta}{dt} - \frac{d\theta'}{dt}\right)$$

and where $\sin(\theta(t) - \theta'(t)) \geq 0$ $$\frac{d}{dt}\left(\frac{d\theta'}{dt} - \omega_o\right) = \frac{a}{2} K_1 K_2 V_1 V_2 \cos(\theta(t) - \theta'(t)) +$$

$$\frac{\alpha}{2} K_1 K_2 V_1 V_2 \sin(\theta(t) - \theta'(t)) \left(\frac{d\theta}{dt} - \frac{d\theta'}{dt}\right)$$

It is usual to reduce these equations by putting:

$$\phi = \theta - \theta'; \quad \omega_n = \sqrt{\tfrac{1}{2} a K_1 K_2 V_1 V_2};$$

$$\zeta = \tfrac{1}{2}\sqrt{\tfrac{1}{2}\frac{K_1 K_2 V_1 V_2}{a}} \quad \text{and } \tau = \omega_n t$$

Whence:

$$\begin{cases} \dfrac{d^2\phi}{d\tau^2} - 2\zeta \dfrac{d\phi}{d\tau} \sin\phi + \cos\phi - \dfrac{d^2\theta}{d\tau^2} = 0 \text{ when } \sin\phi \geq 0 \\ \dfrac{d^2\phi}{d\tau^2} + 2\alpha\zeta \dfrac{d\phi}{d\tau}\sin\phi + \cos\phi - \dfrac{d^2\theta}{d\tau^2} = 0 \text{ when } \sin\phi \geq 0 \end{cases} \quad (5)$$

The first of the equations (5), taken independently from the condition $\sin\phi < 0$ corresponds to the equation of operation of a conventional second order phase-locked loop. The constant $\omega_n$ then appears as the undamped natural angular frequency of the loop and $\zeta$ appears as a damping factor.

The system of differential equations 5 can be solved graphically in the phase plane $$\left(\frac{d\theta}{d\tau}, \phi\right).$$

To show the advantages of the phaselocked loop in accordance with FIG. 1 in relation to conventioal second order phase-locked loops it will suffice to compare the equations of operation of both phase-locked loops in the case where the reference oscillation frequency is not varying, i.e. in the case where $$\frac{d^2\theta}{d\tau^2}$$

is zero.

Figure 2:
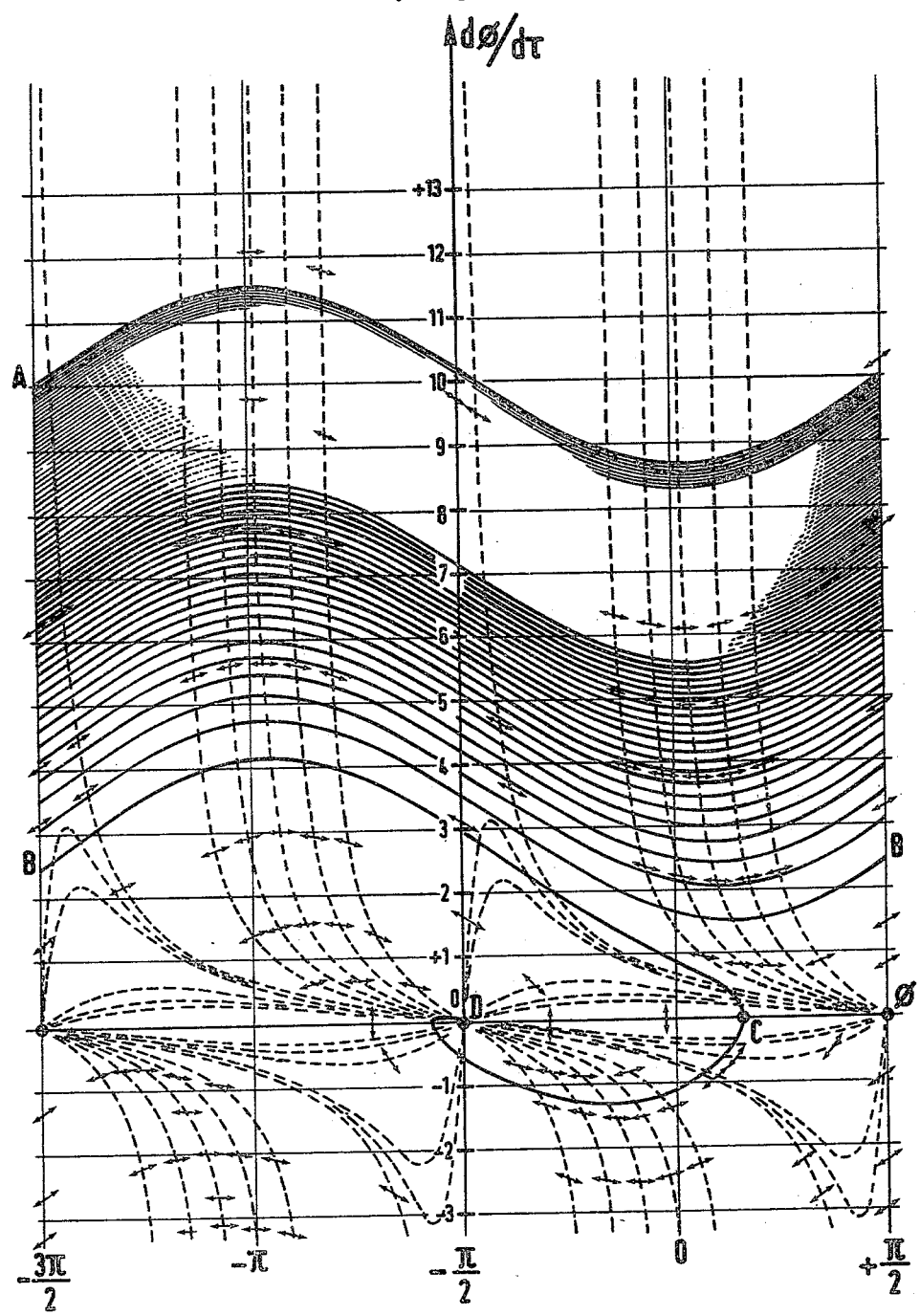
FIGS. 2 and 3 are graphs, which illustrate, respectively the behaviour of a conventional second order phase-locked loop and the behaviour of the phase-locked loop illustrated in FIG. 1.

FIG. 2 represents a graphical solution in the phase plane of the differential equation:

$$\frac{d^2\phi}{d\tau^2} - 2\zeta \frac{d\phi}{d\tau} \sin\phi + \cos\phi = 0$$

which governs the behaviour of a conventional second order phase-locked loop.

The loop has operation equilibrium points determined by the conditions:

$$\frac{d^2\phi}{d\tau^2} = 0 \text{ and } \frac{d\phi}{d\tau} = 0$$

There are two types of equilibrium point:

$$\phi = -\frac{\pi}{2} + 2K\pi \text{ and } \phi = \frac{\pi}{2} + 2K\pi,$$

K being a real integer and it is demonstrated that only one of them is stable:

$$\phi = \frac{-\pi}{2} + 2K\pi$$

The integral solution curve has been drawn for a damping factor $\zeta$ equal to $\sqrt{2}/2$ and wherein the starting conditions are:

$$\frac{d\phi}{d\tau} = 10 \text{ and } \phi = -3\frac{\pi}{2}$$

It has been drawn from the isoclines drawn in dashed lines and defined by the equation:

$$\frac{d\left(\dfrac{d\phi}{d\tau}\right)}{d\phi} = Q \frac{d\phi}{d\tau} = \frac{-\cos\phi}{Q - 2\zeta \sin\phi}$$

Q being the angular coefficient of the tangent of the solution functions at the points where they intersect the isocline in question.

The integral curve has three characteristic parts. Its first part lies between the points A and B and corresponds to frequency pursuit. During pursuit the phase shift $\phi$ skips a great number of cycles which have not all been shown because of their density. The frequency $d\phi/dt$ of the beat between the reference oscillation and that of the oscillator 1 varies about an average value which decreases slowly. The second part of the curve lying between the points B and C corresponds to frequency locking with a non-zero phase error and its third part lying between points C and D corresponds to phase locking.

It is seen in FIG. 2 that during frequency pursuit, the frequency of the beat between the oscillator and the reference oscillator lead tends to decrease in the portion of the plane delimited by the insoclines of equations:

$$y = \frac{1}{2\zeta} \cot \phi \text{ and the straight line } \phi = 0 \text{ (rad)}$$

where $-\pi < \phi < \frac{\pi}{2}$ and where $\frac{d\phi}{d\tau} > 0$;

And tends to increase in the complementary phase-portion in relation to the interval $$\phi \in \left[ \frac{-3\pi}{2}, \frac{\pi}{2} \right].$$

The increase in the beat frequency during a half period of the cycle skips is one of the main reasons for the length of the capture time of the phase-locked loop.

In the phase-locked loop in accordance with FIG. 1, it has been attempted to avoid the increase of the beat frequency by modifying the equation of operation for phase shift values $\Phi$ lying in the range.

$$\left[ \frac{-3\pi}{2}, -\pi \right] \cup \left[ 0, \frac{\pi}{2} \right]$$

i.e. where $\sin \phi \geq 0$ which corresponds approximately to the values at which the increase occurs, since the isoclines of equation:

$$y = \frac{+1}{2\zeta} \cot \phi$$

merge practically with the straight lines of equation $$\Phi = K\pi \quad K = 0, 1, 2 \ldots \text{ and } K = -1, -2, -3$$

as soon as the value of $d\phi/d\tau$ becomes high; this is the case during the frequency pursuit.

Figure 3:
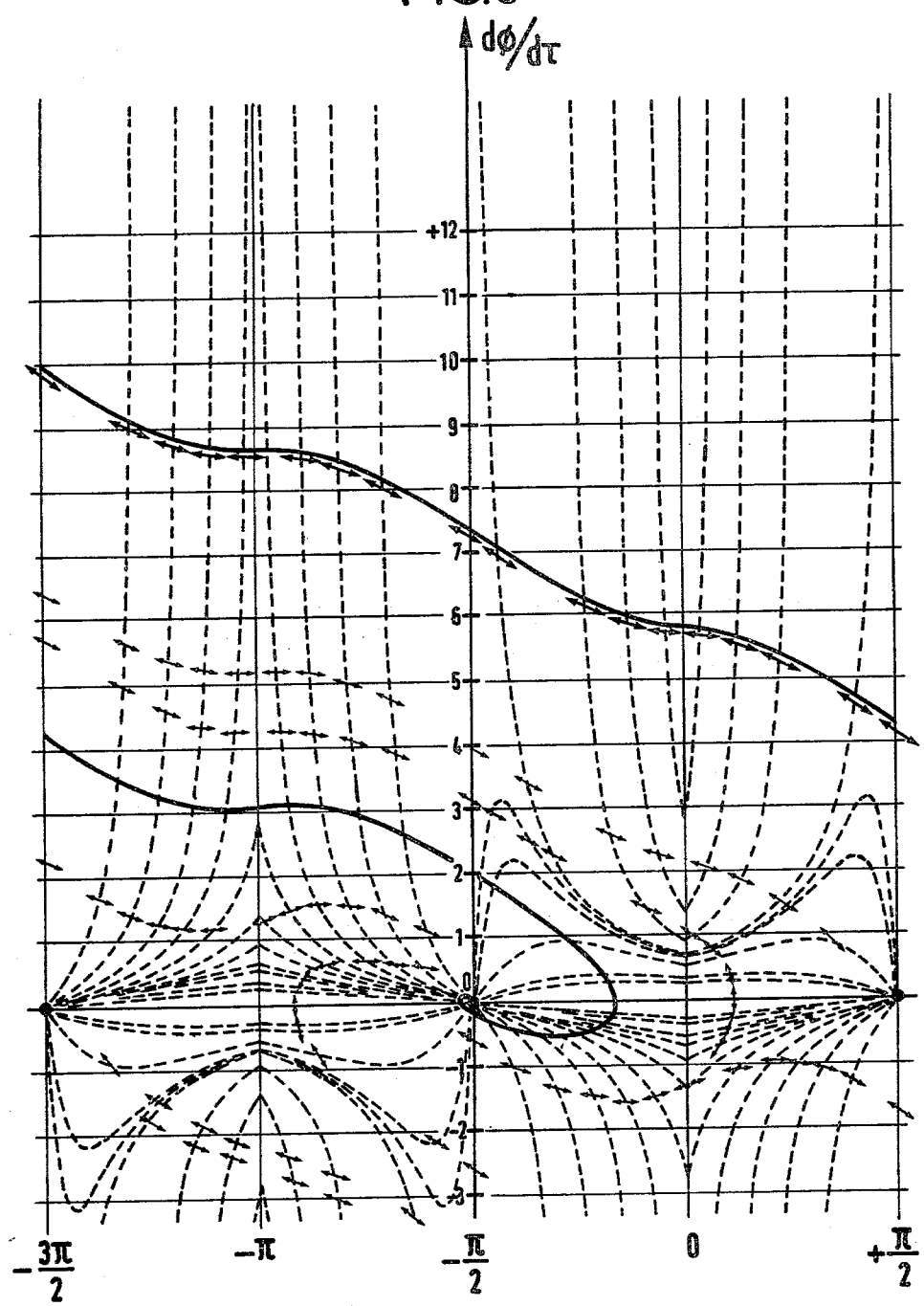

FIG. 3 represents a graphical solution in the phase plane $$\left( \frac{d\phi}{d\tau}, \phi \right)$$

of the system of differential equations:

$$\frac{d^2\phi}{d\tau^2} - 2\zeta \frac{d\phi}{d\tau} \sin \phi + \cos \phi = 0 \quad \sin \phi < 0$$

$$\frac{d^2\phi}{d\tau^2} + 2\alpha\zeta \frac{d\phi}{d\tau} \sin \phi + \cos \phi = 0 \quad \sin \phi \geq 0$$

which govern the behaviour of the phase-locked loop in FIG. 1.

The loop has operation equilibrium points determined by the conditions:

$$\frac{d^2\phi}{d\tau^2} = 0 \text{ and } \frac{d\phi}{d\tau} = 0 \quad \cos \phi = 0$$

As in the preceding case, there are two types of equilibrium points:

$$\phi = \frac{-\pi}{2} + 2K\pi \quad \text{and} \quad \phi = +\frac{\pi}{2} + 2K\pi,$$

K being a real integer and it is demonstrated that only one of them is stable $$\phi = \frac{-\pi}{2} + 2K\pi$$

The integral solution curve shown in an unbroken line has been drawn for a damping factor $\zeta$ equal to $\sqrt{2}/2$, a factor $\alpha$ equal to 1, and with the following starting conditions:—

$$\frac{d\phi}{d\tau} = 10 \quad \text{and} \quad \phi = -\frac{3\pi}{2}$$

It has been drawn in the portion of the phase plane $$\left( \frac{d\phi}{d\tau}, \phi \right)$$

the condition $\phi \in [0, -\pi]$ on the basic of isoclines of equation:

$$\frac{d\phi}{d\tau} = \frac{-\cos \phi}{q - 2\zeta \sin \phi}$$

and in the complementary part about the interval $$\phi \in \left[ \frac{-3\pi}{2}, \frac{\pi}{2} \right]$$

of the phase plane by isoclines of equation:

$$\frac{d\phi}{d\tau} = \frac{-\cos \phi}{q + 2\zeta \sin \phi}$$

In FIG. 3, it is observed that the phase-locked loop now skips only one cycle for capture; this provides a considerable gain in time since the natural angular frequency $\omega_n$ has remained constant.

As is seen in FIG. 3, the improvement is due to the practically complete cancellation of the periods of beat frequency increase between the reference oscillation and that supplied by the controlled oscillation. The cancellation of these periods makes the loop operate with the frequency locked during capture.

It is also observed that the phase-locked loop in accordance with FIG. 1 is identical to a conventional second order phase-locked loop in the zone where $\sin \phi$ is negative and that consequently the results relating to the linear behaviour of the latter are applicable thereto.

A more thorough examination of the phase-locked loop in accordance with FIG. 1 (especially when the reference oscillation is a ramp with a frequency of $d^2\phi/d\tau^2 = R \neq 0$) shows that the frequency acquisition range of the loop is no longer limited except by the frequency response of the phase comparator.

Figure 4:
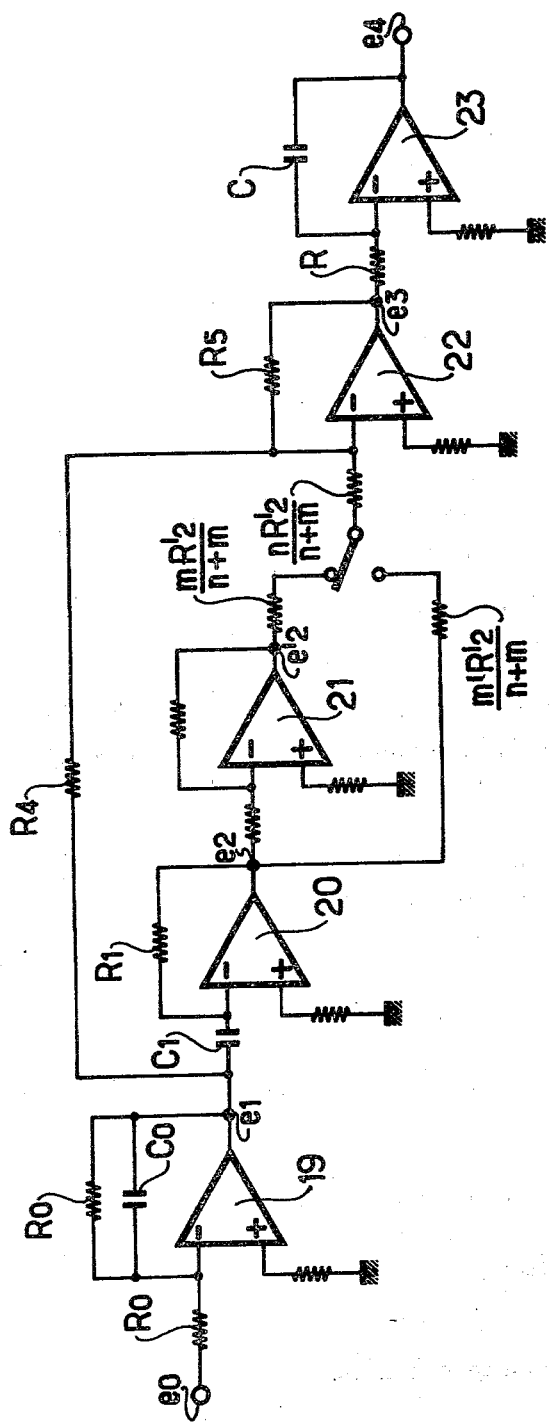
FIG. 4 is a black diagram which shows a possible embodiment of the first low-pass filter of the phase-locked loop illustrated in FIG. 1.

FIG. 4 illustrates an embodiment of the first low-pass filter 3, showing:

a first operational amplifier 19 connected as a low-pass filter with a parallel circuit $R_oC_o$ connected between its output and its inverting input which is also connected by a resistor $R_o$ to the input of the circuit;

a second operational amplifier 20 connected as a differentiator with a resistor $R_1$ connected between its output and its inverting input which is also connected by capacitance $C_1$ to the output of the first operational amplifier 19;

a third operational amplifier 21 connected as an inverting amplifier with unity gain connected downstream from the second operational amplifier 20;

a fourth operational amplifier 22 connected as a summing circuit, having its inverting input connected firstly to the output of the first operational amplifier 19 via a resistor $R_4$ and secondly via a resistor with a value of:

$$\frac{n R'_2}{n + m}$$

to a switching device which connects it either to the output of the third operational amplifier 21 via a resistor with a value of:

$$\frac{m R'_2}{n + m}$$

or to the output of the operational amplifier 20 via a resistor with a value of:

$$\frac{m' R'_2}{n + m};$$

and a fifth operational amplifier 23 connected as an integrator by means of a capacitance C connected between its output and its inverting input which is itself connected to the output of the fourth operational amplifier 22 via a resistor R. Where $e_o$ is the input signal of the circuit and $e_1$ is the output signal of the first operational amplifier 19, we have:

$$e_1(p) = - e_o(p) \frac{1}{1 + R_o C_o p}$$

Where $e_2$ is the output signal of the second operational amplifier 20, we have:

$$e_2(p) = -e_1(p) \cdot R_1 C_1 p$$

Where $e'_2$ is the output signal of the third operational amplifier 21 connected as an inverter with unity gain, we have:

$$e'_2(p) = -e_2(p)$$

Where $e_3$ is the output signal of the fourth operational amplifier 22, we have:

$$e_3(p) = - e_1(p) \frac{R_5}{R_4} - \frac{R_5}{R'_2} e'_2(p)$$

or $$e_3(p) = - e_1(p) \frac{R_5}{R_4} - \frac{R_5}{R'_2} \frac{n + m}{n + m'} e_2(p)$$

depending on the position of the switch.

Where $e_4$ is the output signal of the fifth operational amplifier 23, we have:

$$e_4(p) = - e_3(p) \frac{1}{RC_p}$$

The transfer function of the low-pass filter is deduced from the preceding equations:

$$\frac{e_4(p)}{e_o(p)} = - \frac{1}{RC_p} \times \frac{R5}{R4} \times \left(1 + \frac{R4}{R'2} R1C1_p \right) \times \frac{1}{1 + R_o C_o p} \quad (6)$$

or $$\frac{e_4(p)}{e_o(p)} = - \frac{1}{RC_p} \times \frac{R5}{R4} \times \left(1 - \frac{R4}{R'2} \frac{n + m}{n + m'} R1C1_p \right) \times \frac{1}{1 + R_o C_o p} \quad (7)$$

depending on the position of the switch.

The transfer function defined by equation (6) is obtained when the switch connects the input of the fourth operational amplifier 22 to the output of the third operational amplifier 21. It is brought by changes of constants to the form:

$$\beta \cdot \frac{1}{p + c} \cdot \frac{a + p}{p}$$

It will therefore be used when sin $\phi$ is negative.

The transfer function defined by equation (7) is obtained when the switch connects the input of the fourth operational amplifier 22 to the output of the second amplifier 20. It is brought by changes of constants to the form:

$$\beta \frac{1}{p + c} \times \frac{a - ap}{p}$$

It will be used when sin $\phi$ is positive or zero.

The switching arrangement is advantageously formed by means of analog gates.

The phase-locked loop which has just been described is used advantageously for coherent detection and selective filtering. It is particularly advantageous because of the narrowness of its pass-band after capture and because of the width of its frequency acquisition range.

It is self-evident that without going beyond the scope of the invention, some dispositions can be modified or some means can be replaced by equivalent means.

I claim:

1. A phase-locked loop including: a voltage-controlled variable-frequency oscillator, a first cosine characteristic phase comparator having inputs receiving a reference oscillation and an oscillation supplied by the oscillator, a first low-pass filter connected between the output of the phase comparator and a frequency control input of the oscillator, said low-pass filter being provided with a switchable structure for selecting one of two possible configurations, a second cosine characteristic phase comparator having inputs receiving the reference oscillation and the oscillation which comes from the oscillator, a phase shifter for delaying one of said oscillations by $\pi/2$ radians before being applied to said second phase comparator, a second low-pass filter connected to the output of the second phase comparator, a polarity detector connected to the output of said second low-pass filter, and a changeover switch controlled by the polarity detector included in the first low-pass filter for switching between the two possible configurations thereof, and wherein in a first configuration, the first low-pass filter has a transfer function of the form:

$$F_1(p) = \frac{a+p}{p} \cdot \frac{1}{p+c}$$

with a and c as real and positive constants and p as the complex variable of the Laplace transform, and in a second configuration, said filter has a transfer function of the form:

$$F_2(p) = \frac{a - \alpha p}{p} \cdot \frac{1}{p+c}$$

with $\alpha$ as a real and positive non-zero constant.

2. A phase-locked loop according to claim 1 wherein the phase shifter is disposed between the voltage controlled variable frequency oscillator and the second phase comparator, and wherein the switching circuit is controlled by the polarity detector so as to impart the transfer function $F_1(p)$ to the first low-pass filter when said polarity detector detects a negative signal and the transfer function $F_2(p)$ when said polarity detector detects a positive or zero signal.

3. A phase-locked loop according to claim 1, wherein the first lowpass filter comprises a first integrator circuit placed at its output and preceded by a two-input summing circuit, both inputs being connected to the output of a low-pass circuit placed at the input of the filter, one directly and the other by means of a switching circuit via a differentiator circuit.

4. A phase-locked loop according to claim 1, wherein the first low-pass filter comprises:
  a first operational amplifier placed at the input and connected as a low-pass filter with parallel RC circuit connected between its output and its inverting input and having its inverting input connected via a resistance to the input of said low-pass filter;
  a second operational amplifier connected as a differentiator with a resistance connected between its output and its inverting input which is connected by a capacitance to the output of the first operational amplifier;
  a third operational amplifier connected as an inverting amplifier and connected downstream from the second operational amplifier;
  a fourth operational amplifier connected as a summing circuit, having its inverting input connected firstly to the output of the first operational amplifier via a resistance $R_4$ and secondly via a resistance with a value of $$\left(\frac{n R'2}{m+n}\right)$$

to a switching device which connects it to the output of the third operational amplifier via a third resistance of value $$\left(\frac{mR'2}{m+n}\right);$$

and a fifth operational amplifier connected as an integrator by means of a capacitance connected between its output and its inverting input which is connected via a resistance to the output of the fourth operational amplifier.

5. A phase-locked loop according to claim 1, wherein the first low-pass filter comprises a first integrator circuit placed at its output and preceded by a two-input summing circuit, both inputs being connected to the output of a low-pass circuit placed at the input of the filter, one directly and the other by means of a switching circuit via an inverting amplifier and a differentiator circuit.

6. A phase-locked loop according to claim 2, wherein the first low-pass filter comprises a first integrator circuit placed at its output and preceded by a two-input summing circuit, both inputs being connected to the output of a low-pass circuit placed at the input of the filter, one directly and the other by means of a switching circuit via a differentiator circuit.

7. A phase-locked loop according to claim 2, wherein the first low-pass filter comprises a first integrator circuit placed at its output and preceded by a two-input summing circuit, both inputs being connected to the output of a low-pass circuit placed at the input of the filter, one directly and the other by means of a switching circuit via an inverting amplifier and a differentiator circuit.

8. A phase-locked loop according to claim 1, wherein the first low-pass filter comprises:
  a first operational amplifier placed at the input and connected as a low-pass filter with parallel RC circuit connected between its output and its inverting input and having its inverting input connected via a resistance to the input of said low-pass filter.
  a second operational amplifier connected as a differentiator with a resistance connected between its output and its inverting input which is connected by a capacitance to the output of the first operational amplifier;
  a third operational amplifier connected as an inverting amplifier and connected downstream from the second operational amplifier;
  a fourth operational amplifier connected as a summing circuit, having its inverting input connected firstly to the output of the first operational amplifier via a resistance $R_4$ and secondly via a resistance with a value of $$\left(\frac{n R'2}{m+n}\right)$$

to a switching device which connects it to the output of the second operational amplifier via a third resistance of value $$\left(\frac{m'R'2}{m+n}\right);$$

and a fifth operational amplifier connected as an integrator by means of a capacitance connected between its output and its inverting input which is connected via a resistance to the output of the fourth operational amplifier.

* * * * *